United States Patent [19]

Gay

[11] Patent Number: 5,057,792

[45] Date of Patent: Oct. 15, 1991

[54] CURRENT MIRROR

[75] Inventor: Michael J. Gay, Vaud, Switzerland

[73] Assignee: Motorola Inc., Schaumburg, Ill.

[21] Appl. No.: 556,637

[22] Filed: Jul. 23, 1990

[30] Foreign Application Priority Data

Sep. 27, 1989 [GB] United Kingdom ................ 8921799

[51] Int. Cl.[5] ............................................ H03F 3/04

[52] U.S. Cl. .................................... 330/288; 323/315

[58] Field of Search ................ 330/288; 323/315-317

[56] References Cited

U.S. PATENT DOCUMENTS 4,339,729 7/1982 Jason et al. .................... 330/288 X

*Primary Examiner*—James B. Mullins

*Attorney, Agent, or Firm*—Robert D. Atkins

[57] ABSTRACT

The invention relates to a current mirror circuit (28) comprising: an input node (29); a first simple current mirror (30) of a first type, such as pnp bipolar technology, having an input coupled to said input node (29) and an output; a second simple current mirror (32) of a second semiconductor type, such as npn bipolar technology, having an input coupled to said output of said first simple current mirror and an output; a third simple current mirror (34) of said first semiconductor type having an input coupled to said output of said second simple current mirror and an output coupled to said input node (29); and an output node (31) coupled to said second simple current mirror (32) so as to receive the sum of the input and output currents of said second simple current mirror flowing in a common terminal thereof.

6 Claims, 2 Drawing Sheets

—PRIOR ART—

—PRIOR ART—

—PRIOR ART—

CURRENT MIRROR

This invention relates to current mirrors and particularly to a low-voltage current mirror realised in bipolar technology.

Figure 1:
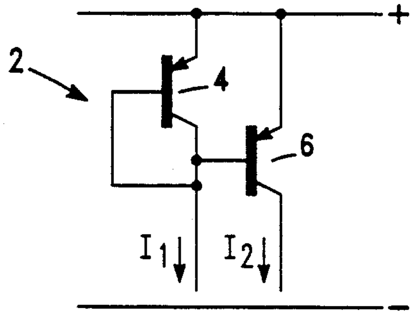

Simple current mirrors, for example the simple current mirror 2 shown in FIG. 1, are well known in the art. However, such arrangements are often insufficiently accurate, particularly when realised with low gain elements such as two lateral pnp transistors 4 and 6. The ratio of output current I2 to input current I1 of the simple current mirror 2 is given by $$\frac{I_2}{I_1} = \frac{1}{1 + \frac{2}{\beta}} \quad (1)$$

where $\beta$ is the current gain of the pnp transistors. Thus, for small values of $\beta$ the accuracy of the simple current mirror is poor.

Figure 2A:
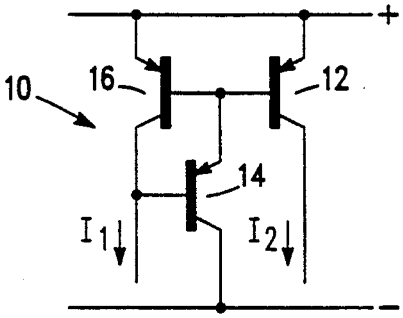
Figure 2B:
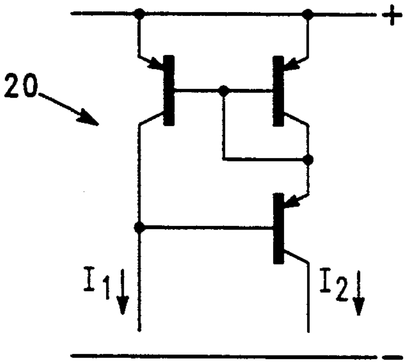

Two circuits 10 and 20 which are commonly used to resolve this problem are shown in FIGS. 2*a* and 2*b*. However, these circuits have a major disadvantage in that two base/emitter junctions are in series at the input node, for example the base/emitter junctions of transistors 12 and 14 of FIG. 2*a*, which doubles the input voltage required compared with the simple current mirror of FIG. 1.

In addition, since the current mirror 10 of FIG. 2*a* has a transistor 14 biassed only by the base current of transistors 12 and 16, the current mirror 10 can suffer from slew-rate problems.

It is an object of the present invention to provide an improved current mirror wherein the above disadvantages are overcome.

In accordance with the present invention there is provided a current mirror circuit comprising:

- an input node;
- a first simple current mirror of a first semiconductor type having an input coupled to said input node and an output;
- a second simple current mirror of a second semiconductor type having an input coupled to said output of said first simple current mirror and an output;
- a third simple current mirror of said first semiconductor type having an input coupled to said output of said second simple current mirror and an output coupled to said input node; and
- an output node coupled to said second simple current mirror so as to receive the sum of the input and output currents of said second simple current mirror flowing in a common terminal thereof.

In a preferred embodiment the first and third simple current mirrors comprise pnp type bipolar transistors and the second simple current mirror comprises npn type bipolar transistors. However, the complementary transistor type may also be used for each of the current mirrors.

Figure 4:
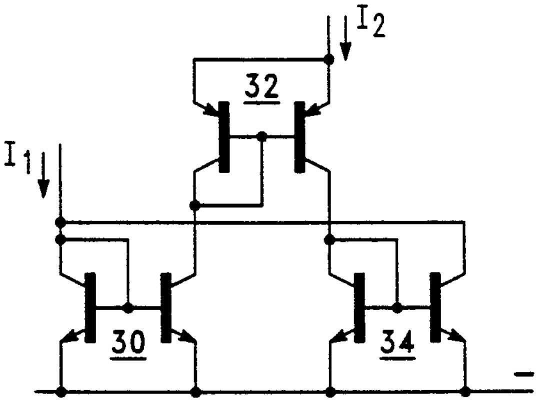
Figure 3:
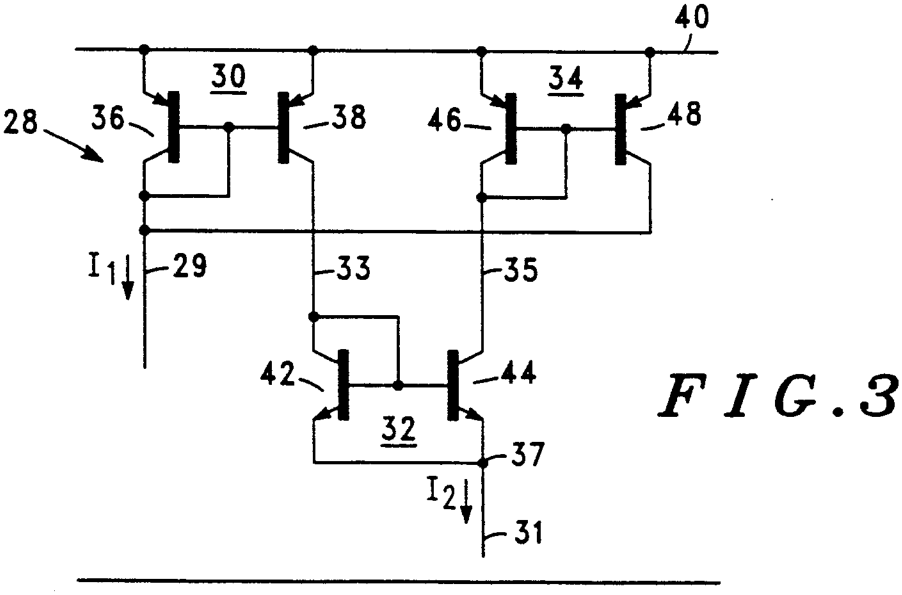

The invention will now be more fully described, by way of example, with reference to the accompanying drawings in which:

FIG. 1 shows a well known simple current mirror circuit;

FIGS. 2*a* and 2*b* show more complicated prior art current mirror circuits; and FIGS. 3 and 4 show current mirror circuits according to the present invention.

The current mirror circuit 28 of FIG. 3 comprises a first simple current mirror 30, a second simple current mirror 32 and a third simple current mirror 34. In a preferred embodiment, the first current mirror 30 and third current mirror 34 are of pnp type and the second current mirror 32 is of npn type.

The first current mirror 30 comprises first and second pnp transistors 36 and 38. The first transistor 36 is coupled as a diode. The emitter electrode of the first transistor 36 is coupled together with the emitter electrode of the second transistor to a positive supply line 40 and the base electrodes of the first and second transistors are coupled together. The collector electrode of the first transistor 36 forms the input of the first current mirror 30 which is coupled to an input node 29 and the collector electrode of the second transistor 38 forms the output of the first current mirror 30 which is coupled to an input of the second current mirror 32 at node 33.

The second current mirror 32 comprises first and second npn transistors 42 and 44. The first transistor 42 is coupled as a diode. The emitter electrode of the first transistor 42 is coupled together with the emitter electrode of the second transistor 44 to a common terminal 37 connected to an output node 31. The base electrodes of the first and the second transistors are coupled together. The collector electrode of the first transistor 42 forms the input of the second current mirror 32 and the collector electrode of the second transistor 44 forms the output of the second current mirror 32 which is coupled to an input of the third current mirror 34 at node 35.

The third current mirror 34 comprises third and fourth pnp transistors 46 and 48. The third transistor 46 is coupled as a diode. The emitter electrode of the third transistor 46 is coupled together with the emitter electrode of the second transistor 48 to the positive supply line 40 and the base electrodes of the third and fourth transistors are coupled together. The collector electrode of the third transistor 46 forms the input of the third current mirror 34 and the collector electrode of the fourth transistor 48 forms the output of the third current mirror 34 which is coupled to the input node 29.

Elementary analysis will show that if the current gains of the mirrors 30, 32 and 34 are M1, M2 and M3 respectively, then the overall current gain, that is the ratio of the output current I2 to the input current I1, of the circuit 28 will be given by:

$$\frac{I_2}{I_1} = \frac{M1\,(1 + M2)}{1 + M1\,M2\,M3} \quad (2)$$

If the gains of the pnp and npn current mirrors are respectively, $$\frac{1}{1 + 2/\beta p} \quad (3)$$

and $$\frac{1}{1 + 2/\beta\eta} \quad (4)$$

then the overall gain of the circuit is:

$$\frac{I_2}{I_1} = 2\frac{\left(1+\frac{1}{\beta\eta}\right)\left(1+\frac{2}{\beta p}\right)}{1+\left(1+\frac{2}{\beta\eta}\right)\left(1+\frac{2}{\beta p}\right)^2} \quad (5)$$

Rearranging this equation gives:

$$\frac{I_2}{I_1} = \frac{1}{1+2\frac{\left(\frac{1}{\beta\eta}+\frac{1}{\beta p}+\frac{2}{\beta\eta\,\beta p}\right)}{\beta p\left(1+\frac{1}{\beta\eta}\right)\left(1+\frac{2}{\beta p}\right)}} \quad (6)$$

$$\simeq \frac{1}{1+\frac{2}{\beta p}\left(\frac{1}{\beta\eta}+\frac{1}{\beta p}\right)} \quad (7)$$

Thus, the gain error is reduced, compared with the simple mirror (equation (1)) by a factor, $$\frac{\beta\eta\,\beta p}{\beta\eta+\beta p} \quad (8)$$

It will be seen by inspection of FIG. 3 that any variations in the voltage applied at the output node 31 appear only between the emitter and collector terminals of transistor 38 and 44. The gains M1, M2 of the first 30 and second 32 current mirrors respectively are consequently modified, by the Early effect, in response to the voltage applied at the output node 31, causing the circuit to have a finite output impedance. Referring to equation 2, and assuming the current mirrors to have unity nominal gain (i.e. M1, M2, M3=1) as in the preferred embodiment, it will be seen that variations in M2 have little effect on the overall gain which varies however according to approximately half the variation in M1. It therefore follows that the output impedance of the circuit is approximately twice that of the impedance of the first current mirror 30. Since the first current mirror 30 operates at approximately one half of the input current I1 as do the second and third current mirrors 32 and 34, it follows that the output impedance of the current mirror circuit 28 will be approximately four times that of a simple current mirror 2 shown in FIG. 1.

The current mirror circuit according to the present invention is unconditionally stable since the open loop gain of the feedback loop is unity. In addition, there are no slew-rate problems since all the devices operate at approximately half the input current.

In summary, the present invention provides a current mirror circuit requiring low input voltages and having a high output impedance. The feedback arrangement of the invention reduces the gain error and thus provides for an improved current mirror circuit wherein the output current will more accurately mirror the input current.

It will be appreciated by those skilled in the art that although the invention has been described wherein the first and third current mirrors are of pnp type and the second current mirror is of npn type, the invention may be realised equally with the pnp current mirrors replaced by npn current mirrors and the npn current mirror with a pnp current mirror, as shown in FIG. 4 with current mirrors 30, 32 and 34 each having opposite polarity transistors and connected to the opposite polarity power supply conductor.

I claim:

1. A current mirror circuit comprising:
an input node;
a first simple current mirror of a first semiconductor type having an input coupled to said input node and an output;
a second simple current mirror of a second semiconductor type having an input coupled to said output of said first simple current mirror and an output;
a third simple current mirror of said first semiconductor type having an input coupled to said output of said second simple current mirror and an output coupled to said input node; and
an output node coupled to said second simple current mirror so as to receive the sum of the input and output currents of said second simple current mirror flowing in a common terminal thereof.

2. A current mirror circuit according to claim 1 wherein said second simple current mirror comprises first and second transistors having a common base electrode, the collector electrode of said first transistor is coupled to said common base electrode and forms the input of said second simple current mirror, the collector electrode of said second transistor forms the output of said second simple current mirror, and the emitter electrodes of said first and second transistors are coupled together to said common terminal which is coupled to said output node of said current mirror circuit.

3. A current mirror circuit according to claim 1 wherein said first simple current mirror comprises first and second transistors having a common base electrode, the collector electrode of said first transistor is coupled to said common base electrode and forms the input of said first simple current mirror, the collector electrode of said second transistor forms the output of said first simple current mirror, and the emitter electrodes of said first and second transistors are coupled together to a first reference potential line.

4. A current mirror circuit according to claim 1 wherein said third simple current mirror comprises first and second transistors having a common base electrode, the collector electrode of said first transistor is coupled to said common base electrode and forms the input of said third simple current mirror, the collector electrode of said second transistor forms the output of said third simple current mirror, and the emitter electrodes of said first and second transistors are coupled together to a first reference potential line.

5. A current mirror circuit according to claim 1 wherein said first semiconductor type comprises npn bipolar technology and said second semiconductor type comprises pnp bipolar technology.

6. A current mirror circuit according to claim 1 wherein said first semiconductor type comprises pnp bipolar technology and said second semiconductor type comprises npn bipolar technology.

* * * * *